US009543006B2

(12) United States Patent
Wu et al.

(10) Patent No.: US 9,543,006 B2
(45) Date of Patent: Jan. 10, 2017

(54) NON-VOLATILE MEMORY CELL AND NON-VOLATILE MEMORY DEVICE

(71) Applicants: Ningbo Advanced Memory Technology Corporation, Ningbo (CN); Being Advanced Memory Taiwan Limited, Hsinchu County (TW)

(72) Inventors: Jui-Jen Wu, Hsinchu County (TW); Jia-Hwang Chang, Hsinchu County (TW); Sheng-Tsai Huang, Hsinchu County (TW); Fan-Yi Jien, Hsinchu County (TW)

(73) Assignees: Ningbo Advanced Memory Technology Corporation, Ningbo (CN); Being Advanced Memory Taiwan Limited, Hsinchu County (TW)

( * ) Notice: Subject to any disclaimer, the term of this patent is extended or adjusted under 35 U.S.C. 154(b) by 0 days.

(21) Appl. No.: 14/875,708

(22) Filed: Oct. 6, 2015

(65) Prior Publication Data

US 2016/0351257 A1    Dec. 1, 2016

(30) Foreign Application Priority Data

May 25, 2015    (CN) .......................... 2015 1 0270878

(51) Int. Cl.
*G11C 13/00*    (2006.01)

(52) U.S. Cl.
CPC .......... *G11C 13/004* (2013.01); *G11C 13/0004* (2013.01); *G11C 13/0069* (2013.01)

(58) Field of Classification Search
CPC ........................... G11C 13/004; G11C 13/0069

USPC ......................................................... 365/163
See application file for complete search history.

(56) References Cited

U.S. PATENT DOCUMENTS

| 6,944,050 | B2* | 9/2005 | Kang | .................... | G11C 11/412 |
| | | | | | 365/154 |
| 7,054,194 | B2 | 5/2006 | Liaw et al. | | |
| 7,791,941 | B2* | 9/2010 | Hanafi | .................. | G11C 11/412 |
| | | | | | 365/158 |
| 7,796,417 | B1* | 9/2010 | Lewis | ..................... | G11C 11/16 |
| | | | | | 365/148 |
| 8,605,490 | B2 | 12/2013 | Fackenthal | | |
| 2011/0085372 | A1* | 4/2011 | Fackenthal | .......... | G11C 14/009 |
| | | | | | 365/156 |
| 2011/0280073 | A1* | 11/2011 | Chiu | .................. | G11C 13/0002 |
| | | | | | 365/185.08 |
| 2012/0320658 | A1* | 12/2012 | Wang | ................. | G11C 14/0054 |
| | | | | | 365/148 |

(Continued)

*Primary Examiner* — Hoai V Ho
*Assistant Examiner* — Muna A Techane
(74) *Attorney, Agent, or Firm* — CKC & Partners Co., Ltd.

(57) ABSTRACT

A non-volatile memory cell and a non-volatile memory device are provided. The non-volatile memory cell includes a latch structure, a first read/write circuit, a first memristor, a second read/write circuit and a second memristor. The first read/write circuit controls a writing operation of the first memristor. The second read/write circuit controls a writing operation of the second memristor. When a restore operation is performed, the data in the latch structure is restored by using the resistance difference between the first memristor and the second memristor. The non-volatile device of the invention combines the advantages of fast memory unit and non-volatile memory, and it may work at a high speed and retain data when powered off.

9 Claims, 8 Drawing Sheets

(56) References Cited

U.S. PATENT DOCUMENTS

2013/0135918 A1\* 5/2013 Kushida ............ G11C 13/0069
                                                    365/145
2014/0119118 A1   5/2014 Lee et al.

\* cited by examiner

NON-VOLATILE MEMORY CELL AND NON-VOLATILE MEMORY DEVICE

RELATED APPLICATIONS

This application claims priority to Chinese Application Serial Number 201510270878.1 filed on May 25, 2015, which is herein incorporated by reference.

BACKGROUND

Field of Invention

The present invention relates to a memory structure. More particularly, the present invention relates to a non-volatile memory structure and related circuits.

Description of Related Art

Memory is an important component in a computer, and many different memory structures have been developed for different applications. For example, the memory structures include dynamic random access memory (DRAM), static random-access memory (SRAM), read-only memory (ROM), flash memory, etc.

Among the memory structures, the ROM and the flash memory belong to non-volatile memory which can retain data when powered off. In general, these two types of non-volatile memory are relatively stable and have less power consumption when storing data, but they are not easy to overwrite and have slower read/write speeds.

Volatile memories such as DRAM and SRAM are generally taken as the main memory incorporated with a central processing unit (CPU) because they have faster read/write speeds. The advantages of DRAM are simple structure (only a transistor and a capacitor are required), high storage density, and lower cost per unit of capacity. In practical, the capacitor of DRAM is periodically charged, and thus it has a disadvantage of higher power consumption.

Compared with DRAM, SRAM retains the stored data without periodically charging the capacitor when powered on. In addition, SRAM generally has faster read speed (higher than DRAM) and very low power consumption. When powered off, the data stored in a conventional SRAM is lost. The conventional SRAM composed of six transistors still has some issues. For example, when a static noise margin (SNM) of the memory cell is not enough, a storage node is vulnerable to the noise from an external bit line, and thus the original stored data is damaged when it is read. Therefore, there is still much to improve for the conventional SRAM.

Along with the trend of thin and light for mobile devices, the space for the electrical device is extremely limited, and the issue of the power consumption gets people's attentions even more. A suitable memory which is capable of providing higher data stability and faster reading speed, and is additionally capable of solving the problems existing in the conventional SRAM is required.

SUMMARY

Recently, as the conventional memory technology have faced the physical limits of scale, developing new memory technology becomes an important research topic in the art. There has been a lot of research for memristor due to its advantages such as simple structure and low power consumption. To solve the aforementioned problems, the present invention provides, based on the memristor, a non-volatile memory device and a memory cell which can be used in any integrated circuit applications (e.g. for controlling a switch in a programmable circuit or for content-addressable memory). The non-volatile memory device and the memory cell in the invention have characteristics of fast reading speed and no needing to update data therein frequently, and the memristor is used to retain the data when powered off. In addition, when the non-volatile memory cell performs a restore operation, a limited clamp voltage is applied on the memristor for making sure the voltage difference between two terminals of the memristor is lower than a limitation value. Therefore, the status of the memristor is prevented from being changed due to excessive input voltage.

One aspect of the invention provides a non-volatile memory cell including a latch structure, a first read/write circuit, a second read/write circuit, a first memristor and a second memristor. The latch structure has a storage node and an inverted storage node, and is configured to store a pair of bits when the non-volatile memory cell is powered by a working voltage. The latch structure is electrically coupled to a reading word line. The first read/write circuit is electrically coupled to a bit line, a first control line and the latch structure. The second read/write circuit is electrically coupled to an inverted bit line, the first control line and the latch structure. The first memristor is electrically coupled to the first read/write circuit and a second control line. The second memristor is electrically coupled to the second read/write circuit and the second control line. When the non-volatile memory cell is powered off, the first memristor and the second memristor are configured to store the pair of bits. When a voltage of the reading word line is at the working voltage, the bit line, the first control line and the second control line control the first read/write circuit to write data from the storage node into the first memristor, or read data from the first memristor into the storage node. The inverted bit line, the first control line and the second control line control the second read write circuit to write data from the inverted storage node into the second memristor, or read data from the second memristor to the inverted storage node.

One aspect of the invention provides a non-volatile memory cell including a latch structure, a fifth transistor, a sixth transistor, a first memristor, a seventh transistor, an eighth transistor and a second memristor. The latch structure includes a first transistor, a second transistor, a third transistor and a fourth transistor. The first transistor and the second transistor forms a first inverter. The third transistor and the fourth transistor forms a second inverter which is cross coupled to the first inverter. The first transistor and the third transistor are coupled to the reading word line. The fifth transistor has a first terminal coupled to the second transistor, a second terminal coupled to system ground, and a control terminal coupled to first control line. The sixth transistor has a first terminal coupled to the first terminal of the fifth transistors and the second terminal of the second transistor, and a control terminal coupled to the bit line. The first memristor has a first resistance after a writing operation is performed thereon, and is coupled between the second terminal of the sixth transistor and the second control line. The seventh transistor has a first terminal coupled to the fourth transistor, a second terminal coupled to the system ground and a control terminal coupled to the first control line. The eighth transistor has a first terminal coupled to the first terminal the seventh transistor and the second terminal of the fourth transistor, and a control terminal coupled to an inverted bit line. The second memristor has a second resistance after the writing operation is performed thereon. The first resistance is different from and logically complemented with the second resistance. The second memristor is coupled between the second terminal of the eighth transistor and the second control line.

Another aspect of the invention provides a non-volatile memory device including multiple aforementioned non-volatile memory cells. Each of the non-volatile memory cells stores a bit, and is coupled to a respective reading word line, a respective bit line, a respective inverted bit line, a respective first control line, a respective second control line and a respective system ground.

As discussed above, the invention has obvious advantages and beneficial effects compared with the prior art. The technical solutions have significant technical improvements and have wide usage values in the industry.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size. In accordance with the standard practice in the industry, various features are not drawn to scale. In fact, the dimensions of the various features may be arbitrarily increased or reduced for clarity of discussion.

Moreover, terms of "comprise", "include", "have", etc. are open transitional phrases meaning "include but not limited to". In addition, the usage "and/or" in the specification includes any one of the listed items or a combination of the items.

In the specification, when a unit is referred to "connected" or "coupled", it means "electrically connected" or "electrically coupled". Terms of "connected" and "coupled" may also represent interactions between two of more units, addition, the using of "first", "second", "third", etc. in the specification should be understood for identify units or data described by the same terminology, but are not referred to particular order or sequence.

Figure 1:
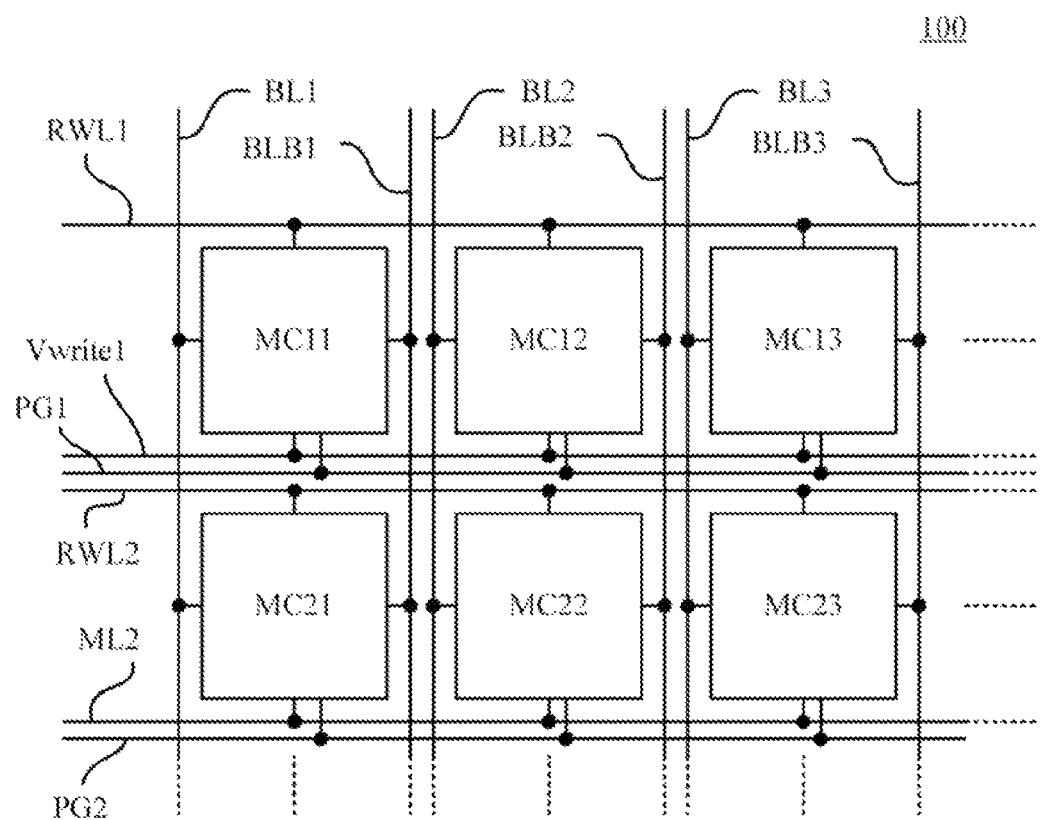
FIG. 1 is schematic diagram illustrating a non-volatile memory device according to an embodiment of the invention.

Referring to FIG. 1, FIG. 1 is schematic diagram illustrating a non-volatile memory device 100 according to an embodiment of the invention. The non-volatile memory device 100 includes multiple non-volatile memory cells, and each of the non-volatile memory cells stores a bit. Six non-volatile memory cells MC11, MC12, MC13, MC21, MC22 and MC 23 are exemplarily illustrated in FIG. 1, but the invention is not limited thereto. In practical, the non-volatile memory device 100 may include lots of non-volatile memory cells. Note that the number of the memory cells and the number of the word lines corresponding to each memory cell may be adjusted according to practical requirement. FIG. 1 just illustrates an example but the invention is not limited thereto.

Each of the non-volatile memory cells MC11-MC23 is coupled to respective bit lines BL1-BL3 and respective inverted bit lines (also referred to bit line bars) BLB1-BLB3. For example, the non-volatile memory cell MC11 is coupled to the bit line BL1 and the inverted bit line BLB1; the non-volatile memory cell MC12, at the same word but at the next bit, is coupled to the bit line BL2 and the inverted bit line BLB2, and so on.

In the embodiment, each of the non-volatile memory cells MC11-MC23 is further coupled to respective reading word lines RWL1-RWL2, first control lines PG1-PG2 and second control lines Vwrite1-Vwrite2. In the embodiment, the non-volatile memory cells MC11, MC12 and MC13 belong to the same word, and therefore they are coupled to the same reading word line RWL1, the same first control line PG1 and the same second control line Vwrite1. In practical applications, a word may include 8, 16, 32 or more bits, which are not illustrated in the figure. People in the art should be able to understand other basic structures of the memory, and therefore the detail will not be described.

Figure 2:
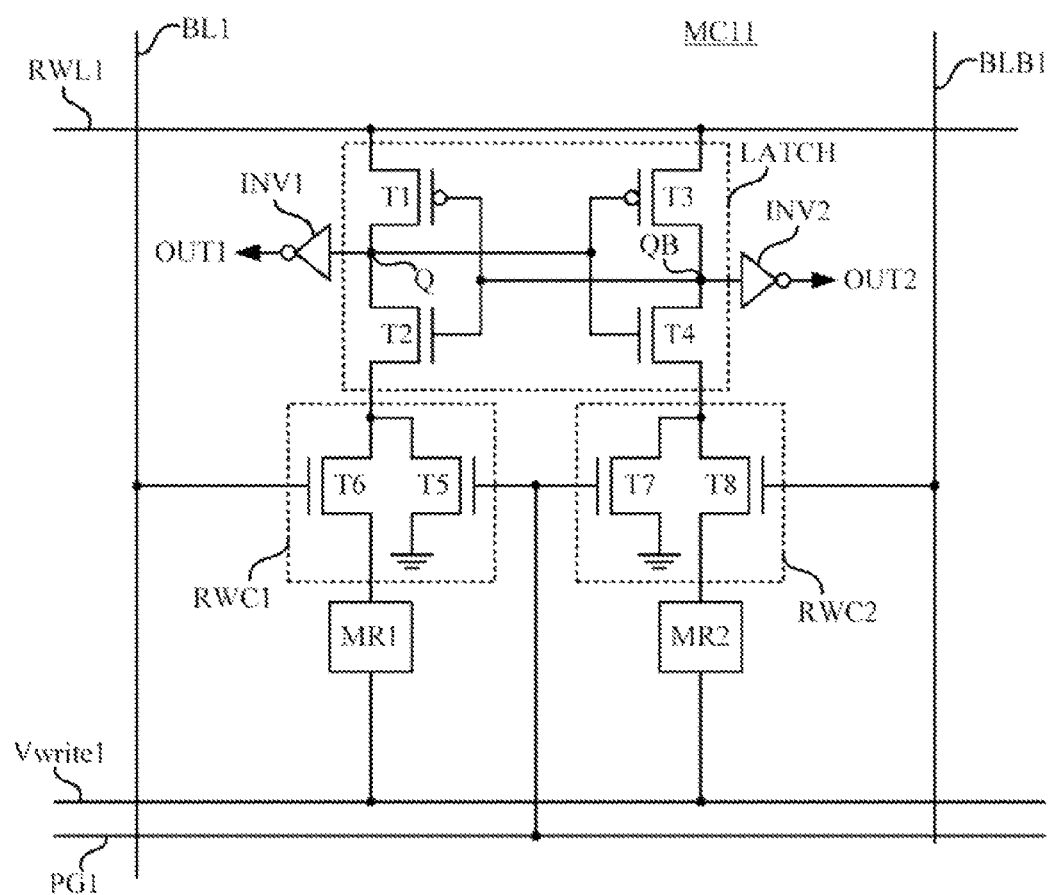
FIG. 2 is an advanced schematic diagram illustrating one of the non-volatile memory cells of the non-volatile memory device in FIG. 1.

Referring to FIG. 2 together, FIG. 2 is an advanced schematic diagram illustrating one of the non-volatile memory cells of the non-volatile memory device 100 in FIG. 1. In the embodiment, each of the non-volatile memory cells MC11-MC23 in FIG. 1 includes the structure similar to the specific structure of the non-volatile memory cell MC11 in FIG. 2, and each of them is incorporated with the respective signal lines (i.e. bit lines, inverted bit lines, reading word lines, first control lines, second control lines, etc.).

As shown in FIG. 2, the non-volatile memory cell MC11 includes a latch structure LATCH (including a first transistor T1, a second transistor T2, a third transistor T3 and a fourth transistor T4), a first read/write circuit RWC1 (including a fifth transistor T5 and a sixth transistor T6), a second read/write circuit RWC2 (including a seventh transistor T7 and an eighth transistor T8), a first memristor MR1 and a second memristor MR2. Each of the transistors T1-T8 has a first terminal, a second terminal and a control terminal.

The latch structure LATCH is electrically coupled to the reading word line RWL1. The latch structure LATCH has a storage node Q and an inverted storage node QB. When the non-volatile memory cell MC11 is powered by a working voltage, the storage node Q and the inverted storage node QB store a pair of bits. The first terminal of the first transistor T1 is coupled to the reading word line RWL1. The first terminal of the second transistor T2 is coupled to the second terminal of the first transistor T1. The control terminals of the first transistor T1 and the second transistor 12 are coupled to each other. The second transistor T2 and the first transistor T1 are turned on exclusively, and thus the first transistor T1 and the second transistor T2 form a first inverter.

The first terminal of the third transistor T3 is coupled to the reading word line RWL1. The first terminal of the fourth transistor T4 is coupled to the second terminal of the third transistor T3. The control terminals of the third transistor T3 and the fourth transistor T4 are coupled to each other. The fourth transistor T4 and the third transistor T3 are turned on exclusively, and thus the third transistor T3 and the fourth transistor T4 form a second inverter.

The control terminals of the third and fourth transistors T3, T4 are coupled to the second terminal of the first transistor T1 and the first terminal of the second transistor T2. The second terminal of the third transistor T3 and the first terminal of the fourth transistor T4 are coupled to the control terminals of the first and second transistors T1, T2. That is, an output terminal (i.e. the storage node Q of the latch structure LATCH in FIG. 2) of the first inverter is connected to an input terminal (i.e. the control terminals of the third and fourth transistors T3, T4) of the second inverter. An output terminal (i.e. the inverted storage node QB of the latch structure LATCH in FIG. 2) of the second inverter is connected to an input terminal (Le the control terminals of the first and second transistors T1, T2) of the first inverter. As a result, the first inverter is cross coupled to the second inverter, and they form the aforementioned latch structure LATCH.

If a bit "1" is stored in the storage node Q, then the inverted storage node QB is set as a bit "0" through the second inverter (i.e. the third and fourth transistors T3, T4), and the bit "1" in the storage node Q is enhanced through the first inverter (i.e. the first and second transistors T1, T2), and vice verse.

The latch structure LATCH is used to temporarily store a bit by the voltage at the storage node Q (and the voltage at the inverted storage node QB). In the embodiment, when the voltage of the reading word line RWL1 is at a high level, the data is kept in the latch structure LATCH. When the voltage of the reading word line RWL1 is at the ground, the data in the latch structure LATCH is lost. Therefore, the non-volatile memory cell MC11 of the invention uses the first memristor MR1 and the second memristor MR2 with the fifth transistor T5 to the eighth transistor T8 to store non-volatile data. The bit is stored by the resistance difference between the first memristor MR1 and the second memristor MR2, and it is not affected when powered off. When the data is to be read, the non-volatile memory cell MC11 performs a restore operation to read the non-volatile data. The detail will be described below.

The first read/write circuit RWC1 is electrically coupled to the bit line BL1, the first control line PG1 and the latch structure LATCH. The first memristor MR1 is electrically coupled to the first read/write circuit RWC1 and the second control line Vwrite1.

As shown in FIG. 2, the first terminals of the fifth and sixth transistors T5, T6 are coupled to the each other. The first terminal, the second terminal and the control terminal of the fifth transistor T5 are respectively coupled to the second terminal of the second transistor T2, a system ground (GND) and the first control line PG1. The first terminal and the control terminal of the sixth transistor T6 are respectively coupled to the second terminal of the second transistor T2 and the bit line BL1. The first terminals of the seventh and eighth transistors T7, T8 are coupled to the each other.

The second read/write circuit RWC2 is electrically coupled to the inverted bit line BLB1, the first control line PG1 and the latch structure LATCH. The second memristor MR2 is electrically coupled to the second read/write circuit RWC2 and the second control line Vwrite1.

The first terminal, the second terminal and the control terminal of the seventh transistor T7 are respectively coupled to the second terminal of the fourth transistor T4, the system ground (GND) and the first control line PG1. The first terminal and the control terminal of the eighth transistor T8 are respectively coupled to the second terminal of the fourth transistor T4 and the inverted bit line BLB1.

The first memristor MR1 has a first resistance after a writing operation is performed thereon. The first memristor is coupled between the second terminal of the sixth transistor T6 and the second control line Vwrite1. The second memristor MR2 has a second resistance after the writing operation is performed thereon. The second memristor MR2 is coupled between the second terminal of the eighth transistor T8 and the second control line Vwrite. The first resistance of the first memristor MR1 is different from and logically complemented with the second resistance of the second memristor MR2.

The memristors adopted for the first memristor MR1 and the second memristor MR2 are passive electronic components. For example, if a phase-changed memristor is adopted, the phase-changed memristor is set to have different resistances according to an amplitude and a duration of the writing current on the memristor. The resistance of the memristor may be one of a high resistance and a low resistance. In the embodiment, the first memristor MR1 is set to have a first resistance, and the second memristor MR2 is set to have a second resistance. The first resistance and the second resistance are different from and logically complemented with the each other. In other words, one of the first memristor MR1 and the second memristor MR2 in the same non-volatile memory cell MC11 has the high resistance and the other one has the low resistance.

In the embodiment of FIG. 2, the non-volatile memory cell MC11 further includes a first inverting amplifier INV1 and a second inverting amplifier INV2. An input terminal of the first inverting amplifier INV1 is coupled between the first transistor T1 and the second transistor T2 (i.e. coupled to the storage node Q). An output terminal of the first inverting amplifier NV1 outputs a first output signal OUT1. An input terminal of the second inverting amplifier INV2 is coupled between the third transistor and the fourth transistor (i.e. coupled to the inverted storage node QB). An output terminal of the second inverting amplifier INV2 outputs a second output signal OUT2. In the embodiment, the first output signal OUT1 and the second output signal OUT2 are logically inversed to the storage node Q and the inverted storage node QB respectively due to the inverse and amplification effects of the first inverting amplifier INV1 and the second inverting amplifier INV2. However, the invention is not limited thereto. In another embodiment, if the first inverting amplifier INV1 and the second inverting amplifier INV2 are replaced with buffer amplifiers, then the first output signal OUT1 and the second output signal OUT2 are logically identical to the storage node Q and the inverted storage node QB respectively, which is also covered by the disclosure.

In the embodiment of FIG. 2, the non-volatile memory cell MC11 is suitable for a programmable circuit and is configured to store a variety of non-volatile data in the programmable circuit. The programmable circuit may be a field-programmable gate array (FPGA) or a programmable logic device (PLD). The non-volatile memory cell MC11 may control a switch in the programmable circuit according to a stored bit such that the programmable circuit may have different operations, functions, or operation characteristics based on the data stored in the non-volatile memory cell MC11.

Figure 3:
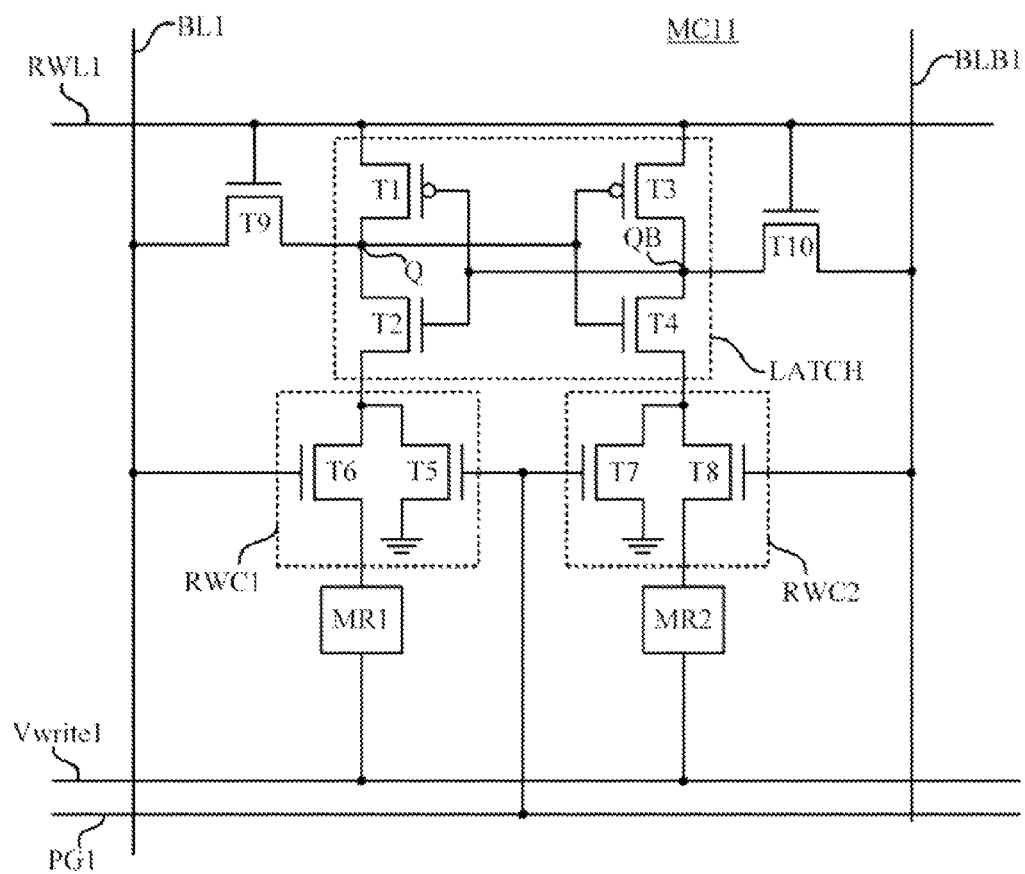
FIG. 3 is a schematic diagram illustrating one of the non-volatile memory cells according to another embodiment of the invention.

Referring to FIG. 3 together, FIG. 3 is a schematic diagram illustrating the non-volatile memory cells MC11 according to another embodiment of the invention. In the embodiment of FIG. 3, the non-volatile memory cell MC11 further includes a ninth transistor T9 and a tenth transistor T10, and each of which has a first terminal, a second terminal and a control terminal. The first terminal, the second terminal and the control terminal of the ninth transistor T9 are respectively coupled to the storage node Q, the bit line BL1 and the reading word line RWL. The first terminal, the second terminal and the control terminal of the tenth transistor T10 are respectively coupled to the inverted storage node QB, the inverted bit line BLB1 and the reading word line RWL1. The ninth transistor T9 and the tenth transistor T10 output the voltages of the storage node Q and the inverted storage node QB to the bit line BL1 and the inverted bit line BLB1 according to the control of the reading word line RWL1.

The latch structure LATCH, formed by the first to the fourth transistors T1-T4, the ninth transistor T9, and the tenth transistor T10 equivalently form a 6T SRAM cell. The operation principle of the 6T SRAM cell is similar to the main structure of the conventional SRAM and they both have relatively faster response speed and lower power consumption. In the embodiment illustrated in FIG. 3, the first terminals of the first transistor T1 and the second transistor T2 are coupled to the reading word line RWL1. In another embodiment, the first terminals of the first transistor T1 and the second transistor T2 may also be coupled to a system high voltage (e.g. a system high voltage Vdd which is not shown in the figure), and this configuration can also implement the operation characteristic of the SRAM cell.

In the two embodiment of FIG. 2 and FIG. 3, although the first inverting amplifier INV1 and the second inverting amplifier INV2 are replaced with the ninth transistor T9 and the tenth transistor T10 in the non-volatile memory cell MC11, they have the same operation principles when the non-volatile memory cell MC11 performs a restore operation to read the non-volatile data and performs the writing operation on the first memristor MR1/second memristor MR2 to store the non-volatile data.

When the non-volatile memory cell MC11 is powered off, the first memristor MR1 and the second memristor MR2 are used to store a pair of bits. When the voltage of the reading word line is at the working voltage, the bit line, the first control line and the second control line control the first read/write circuit to write the data from the storage node into the first memristor, or read the data from the first memristor to the storage node; and the inverted bit line, the first control line and the second control line control the second read/write circuit to write the data from the inverted storage node into the second memristor, or read the data from the second memristor to the inverted storage node.

The detail process and the control signals of the restore operation and the writing operation will be described with reference of the non-volatile memory cell MC11 in the embodiment of FIG. 2, and the same operation may also be applied to the non-volatile memory cell MC11 in the embodiment of FIG. 3

Figure 4A:
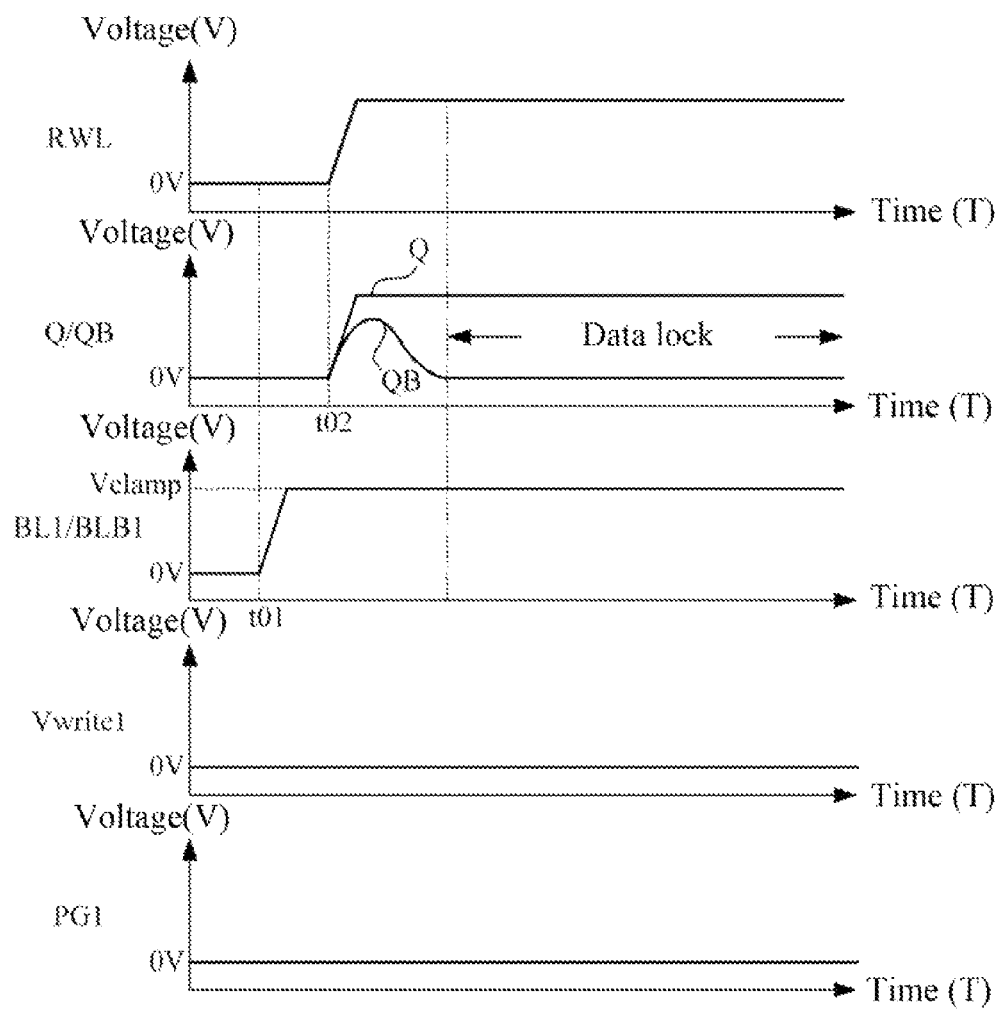
FIG. 4A is a timing chart of related signals when the non-volatile memory cell performs a restore operation to read non-volatile data according to an embodiment.
Figure 4B:
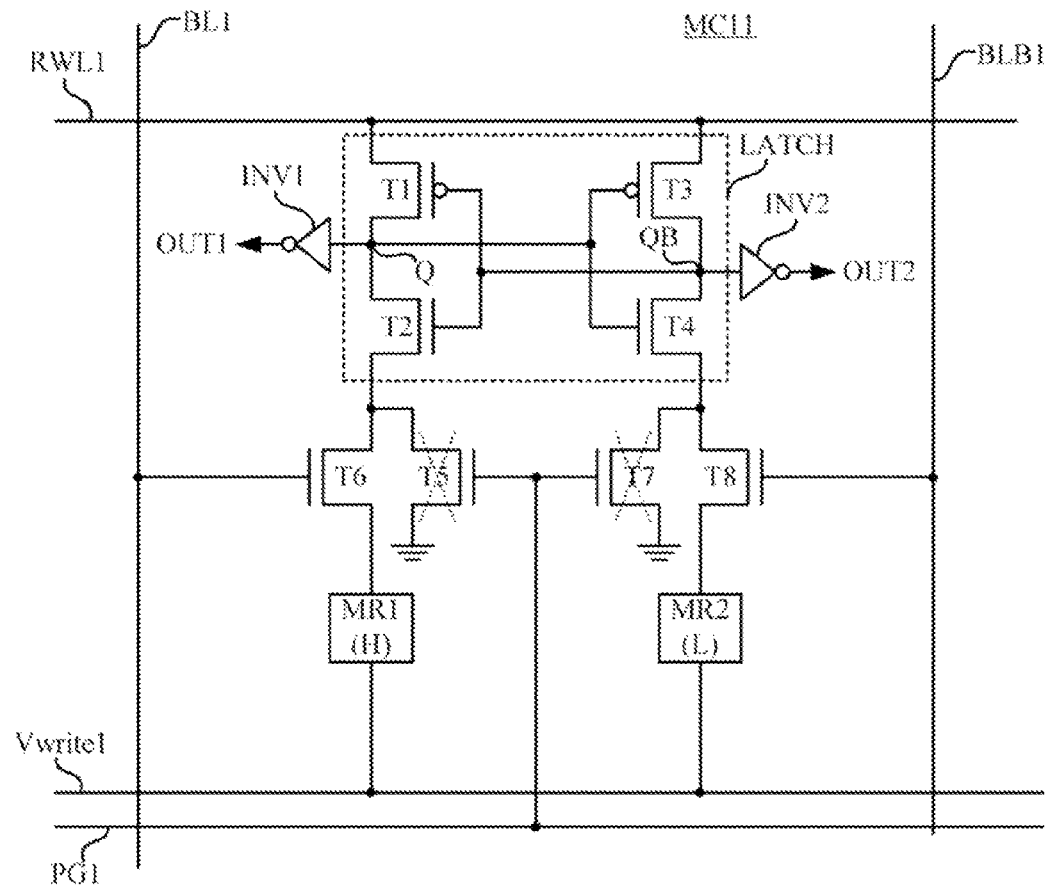
FIG. 4B is a schematic diagram illustrating switching status when the non-volatile memory cell performs the restore operation.

Referring to FIGS. 4A and 4B together, FIG. 4A is a timing chart of related signals when the non-volatile memory cell MC11 performs the restore operation to read the non-volatile data according to an embodiment, and FIG. 4B is a schematic diagram illustrating switching status when the non-volatile memory cell MC11 performs the restore operation.

When the non-volatile memory cell MC11 is powered off, the first memristor MR1 and the second memristor MR2 are used to store the pair of bits which are temporarily stored in the latch structure LATCH in a non-volatile way. When the voltage of the reading word line RWL1 is at the working voltage, the bit line BL1, the first control line PG1 and the second control line Vwrite1 control the first read/write circuit RWC1 to write the data from the storage node Q into the first memristor MR1 (described in the embodiment of the writing operation in following paragraphs), or read the data from the first memristor MR1 to the storage node Q (described in the embodiment of the restore operation in following paragraphs). In addition, the inverted bit line BLB1, the first control line PG1 and the second control line Vwrite1 control the second read/write circuit RWC2 (described in the embodiment of the writing operation in the following paragraphs) to write the data from the inverted storage node QB into the second memristor MR2 or read the data from the second memristor MR2 to the inverted storage node QB (described in the embodiment of the restore operation in the following paragraphs).

As shown in FIG. 4A and FIG. 4B, when the non-volatile memory cell MC11 performs the restore operation to read the non-volatile bit, the first control line PG1 is set to a low voltage to turn off the fifth transistor T5 and the seventh transistor T7. The second control line Vwrite1 is set to a zero voltage (i.e. ground) to ground the second terminals of the first memristor MR1 and the second memristor MR2.

Then, at a time point t01, the voltages of the bit line BL1 and the inverted bit line BLB1 are raised to a clamp voltage Vclamp which is used to turn on the sixth transistor T6 and the eighth transistor T8. The clamp voltage Vclamp is required to be slightly higher than the threshold voltages Vth of the sixth transistor T6 and the eighth transistor T8. As a result, the maximum voltage of the first terminals of the first memristor MR1 and the second memristor MR2 is Vclamp-Vth without supplying an excessive voltage on the first terminals of the first memristor MR1 and the second memristor MR2. Consequently, it avoids a problem that the non-volatile bit is flipped when the non-volatile memory cell MC11 performs the restore operation due to the reading voltage.

Then, at a time point t02, the reading word line RWL1 is raised to a high voltage. The voltage of the reading word line RWL1 makes the voltage of the storage node Q in the first inverter transiently raised due to the voltage division caused by the first transistor T1, the second transistor T2, the sixth transistor T6 and the first memristor MR1; at the same time, the voltage of the reading word line RWL1 makes the voltage of the inverted storage node QB in the second inverter transiently raised due to the voltage division caused by the third transistor T3, the fourth transistor T4, the eighth transistor T8 and the second memristor MR2.

In the embodiment, assume the first resistance of the first memristor MR1 is greater than the second resistance of the second memristor MR2 so that a transient raised speed of the voltage of the storage node Q is greater than a transient raised speed of the voltage of the inverted storage node QB. Next, the voltage of the storage node Q is pushed to a high level and the voltage of the inverted storage node QB is pushed to a low level by the positive feedback effect of the latch structure LATCH based on the resistance difference between the first resistance and the second resistance. Then, the restore operation of the non-volatile memory cell MC11 is accomplished and the voltages of the storage node Q and the inverted storage node QB are locked (i.e. data lock is accomplished) by the latch structure LATCH.

In the embodiment of FIG. 4B, the voltages locked in the storage node Q and the inverted storage node QB may be read out through the first output signal OUT1 or the second output signal OUT2 (or through the bit line BL1/inverted bit line BLB1 with reference of the embodiment of FIG. 3).

In the embodiment, the data stored in the non-volatile memory cell MC11 is defined by the high/low resistance of the first memristor MR1 and the second memristor MR2. For example, if the first memristor MR1 has the high resistance and the second memristor MR2 has the low resistance, then the storage node Q and the inverted storage node QB are respectively pushed to the high level and the low level during the restore operation. In contrast, if the first memristor MR1 has the low resistance and the second memristor MR2 has the high resistance, then the storage node Q and the inverted storage node QB are respectively pushed to the low level and the high level during the restore operation.

One of the advantages of the invention is that the operation of the non-volatile cell is similar to a fast memory unit (e.g. SRAM/DRAM) with high read/write speed when the electronic device is at a working state. Although the conventional non-volatile memory (e.g. flash memory) can retain its data after powered off, the read/write speed of the conventional non-volatile memory is much slower than that of the fast memory unit (e.g. SRAM/DRAM). In summary, the embodiments of the invention have the advantages of the fast memory unit (e.g. SRAM/DRAM) and the non-volatile memory (e.g. flash memory). That is, it works at the high speed and also retains the data when powered off.

Figure 5A:
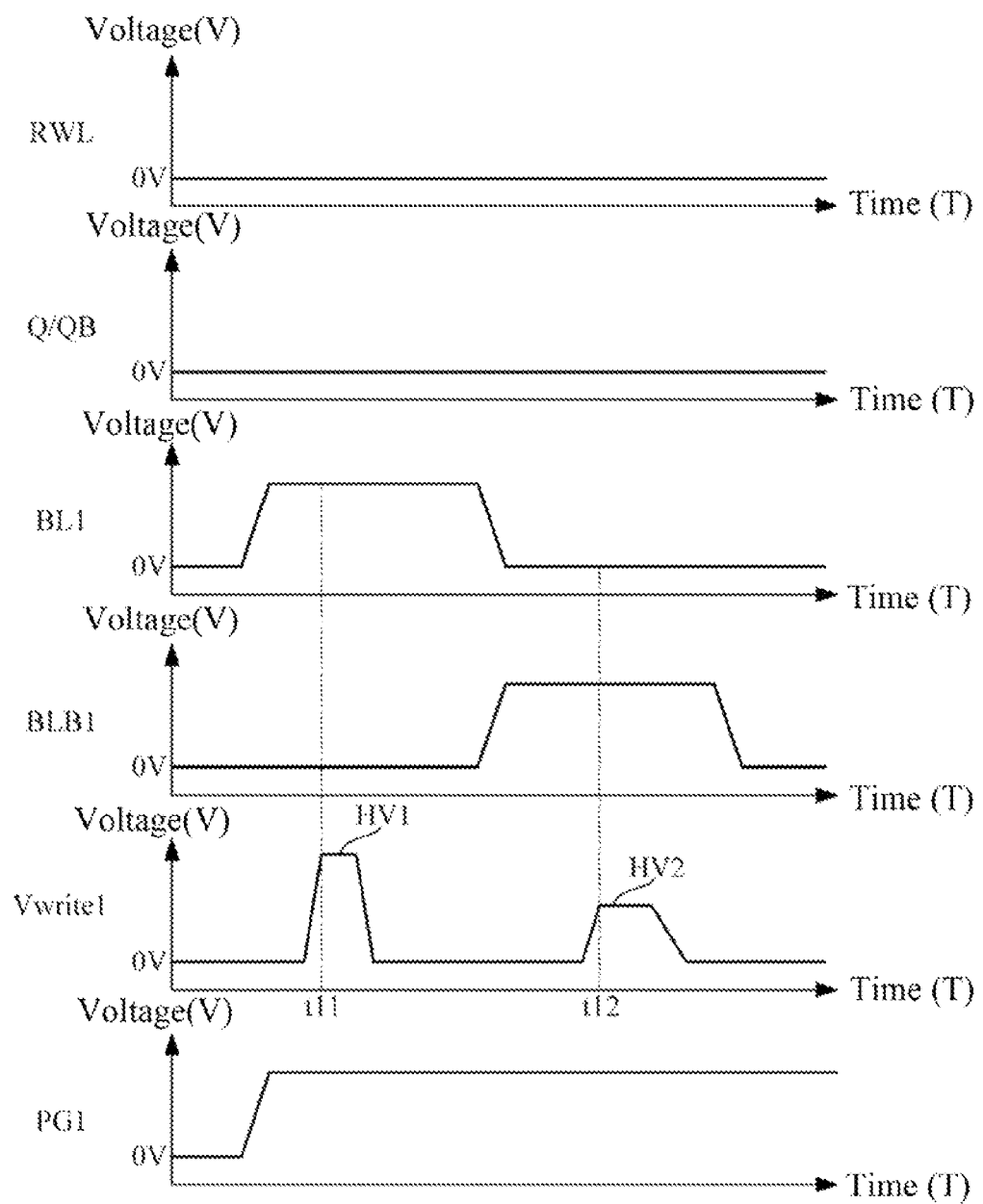
FIG. 5A is a timing chart of related signals when the non-volatile memory cell performs a writing operation according to an embodiment.
Figure 5B:
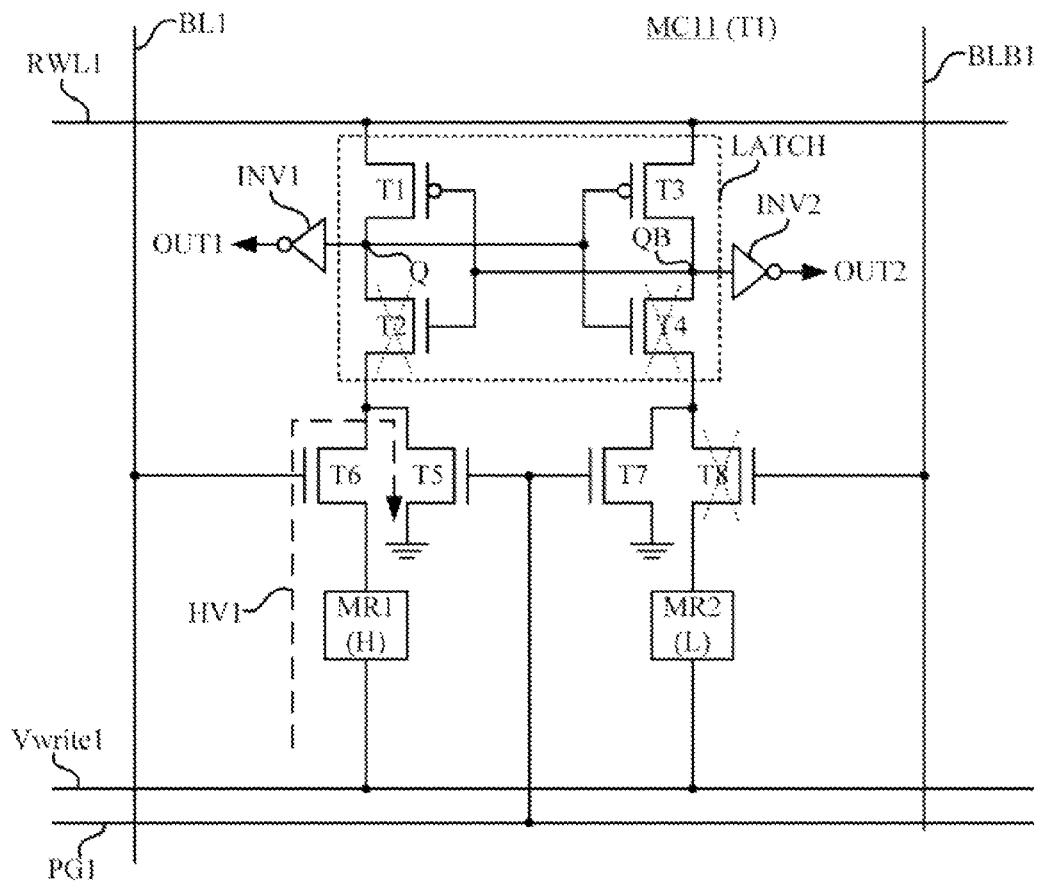
FIG. 5B is a schematic diagram illustrating switching status when the non-volatile memory cell performs the writing operation on a first memristor.
Figure 5C:
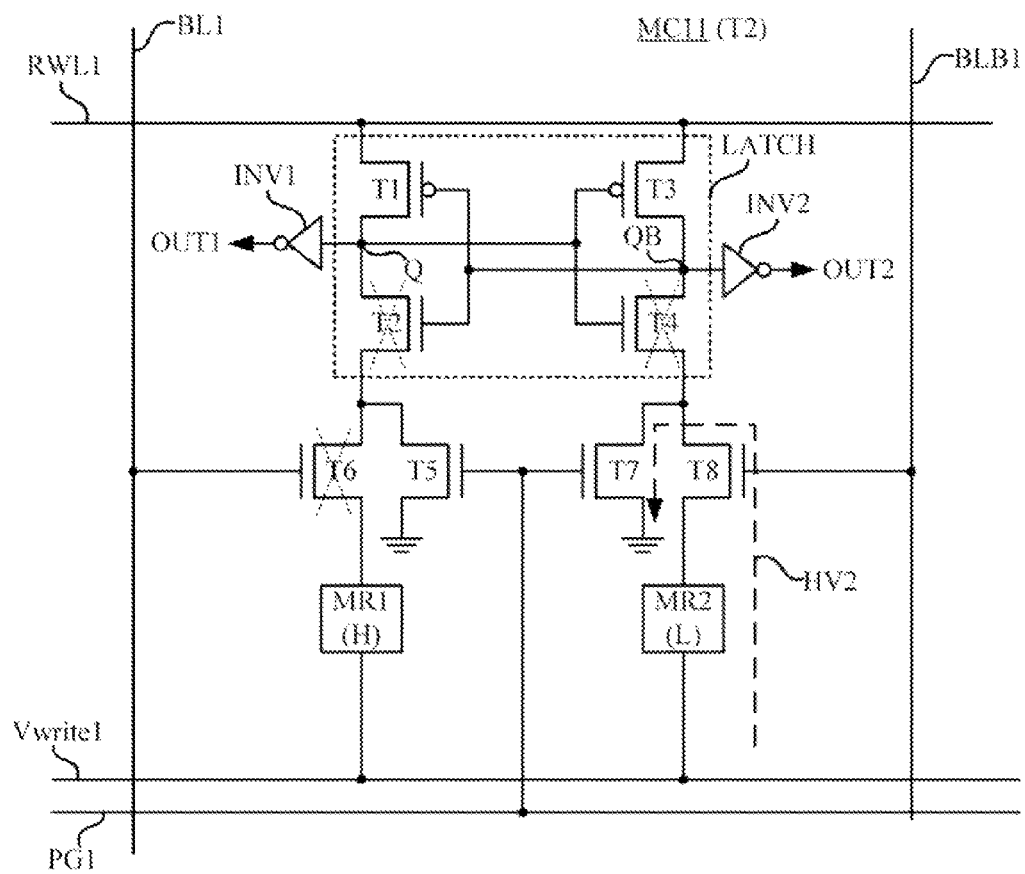
FIG. 5C is a schematic diagram illustrating switching status when the non-volatile memory cell performs the writing operation on a second memristor.

Then, the programming of the resistances of the first memristor MR1 and the second memristor MR2 will be described. Referring to FIGS. 5A, 5B and 5C. In FIGS. 5A and 5B, the non-volatile memory cell MC11 first performs the writing operation on the first memristor MR1, but the invention is not limited to this order. First, the first control line PG1 is raised to the high voltage to turn on the fifth transistor T5 and the seventh transistor T7, and the bit line BL1 is raised to the high voltage to turn on the sixth transistor T6 (at this time, the inverted bit line BLB1 is at the low level to turn off the eighth transistor T8). Hereinafter, at a time point t11, the second control line Vwrite1 inputs a first writing pulse (shown as a first writing voltage pulse HV1 in FIG. 5A) to the first memristor MR1 in order to set the first resistance. Then, referring to FIGS. 5A and 5C, the bit line BL1 drops to the low voltage (the sixth transistor T6 is turned off), and at the same time, the bit line BLB1 is raised to the high voltage to turn on the eighth transistor T8. Afterwards, at a time point t12, the second control line Vwrite1 inputs a second writing pulse (shown as a second writing voltage pulse HV2 in FIG. 5A) to the second memristor MR2 in order to set the second resistance, and then the writing operation of the second memristor MR2 is done.

The first writing voltage pulse HV1 and the second writing voltage pulse HV2 have different pulse waveforms and voltage amplitudes (or current amplitudes) such that the first memristor MR1 and the second memristor MR2 have different resistances. For example, as shown in FIG. 5A, the first writing voltage pulse HV1 is a pulse with shorter pulse-width and larger variation to make the first memristor MR1 have higher resistance; the second writing voltage pulse HV2 is a pulse with longer pulse-width and smaller variation to make the second memristor MR2 have lower resistance, but the memristors of the invention are not limited to the material related to lattice orientation or states type. In practical applications, any memristor adopting other writing principles may be suitable. Note that the first and second writing voltage pulse HV1, HV2 may be replaced with a first writing current pulse and a second writing current pulse with different current pulse-width and amplitudes. Therefore, the unit at the vertical axis of the second control line Vwrite 1 in FIG. 5A may be ampere.

In practical applications of field-programmable gate array (FPGA) and programmable logic device (PLD), SRAM is required to save configurations of the FPGA/PLD. However, SRAM loses the data when powered off. Therefore, when using the FPGA/PLD, the data needs to be loaded into the SRAM first when powered on, then the FPGA/PLD can be configured.

The non-volatile memory device of the invention have the advantages of the conventional SRAM and the non-volatile memory. When using the FPGA/PLD and about to be powered off, the invention first write the data of "0" or "1" from the latch structure LATCH of each memory cell into the first memristor MR1 and the second memristor MR2 according to the writing operation described in the aforementioned embodiments. As a result, when the FPGA/PLD is powered off, the configuration data is still stored in the first and the second memristor MR1, MR2; when the FPGA/PLD is powered on, the data of "0" or "1" in the first and the second memristor MR1, MR2 can be restored back to the latch structure LATCH immediately without loading the configuration data. As a result, the resource and startup time of the FPGA/PLD are reduced. However, the embodiments are just for exemplary explanation, and the usage of the FPGA/PLD is not limited in the invention. As long as the electronic device needs to retain data when powered off and needs to access data in a high speed during working, it is in the scope of the invention.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. For example, the number of memory cells or the number of the word lines corresponding to each memory cell may be changed. In view of the foregoing, it is intended that the present invention cover modifications and variations of this invention provided they fall within the scope of the following claims.

What is claimed is:

1. A non-volatile memory cell comprising:
   a latch structure having a storage node and an inverted storage node, configured to store a pair of bits when the non-volatile memory cell is powered by a working voltage, wherein the latch structure is electrically coupled to a reading word line;
   a first read/write circuit, electrically coupled to a bit line, a first control line and the latch structure;
   a second read/write circuit, electrically coupled to an inverted bit line, the first control line and the latch structure;
   a first memristor, directly connected to the first read/write circuit and a second control line; and
   a second memristor, directly connected to the second read/write circuit and the second control line, wherein the first read/write circuit comprises a fifth transistor and a sixth transistor, and the second read/write circuit comprises a seventh transistor and an eighth transistor;

each of the fifth transistor, the sixth transistor, the seventh transistor and the eighth transistor has a first terminal, a second terminal and a control terminal;

the second terminal of the fifth transistor is coupled to a system ground, and the control terminal of the fifth transistor is coupled to the first control line;

the second terminal of the sixth transistor is coupled to the first memristor and the control terminal of the sixth transistor is coupled to the bit line;

the first terminal the fifth transistor is connected to the first terminal of the sixth transistor, and is electrically coupled to the latch structure;

the second terminal of the seventh transistor is coupled to the system ground and the control terminal of the seventh transistor is coupled to the first control line;

the second terminal of the eighth transistor is coupled to the second memristor, and the control terminal of the eighth transistor is coupled to the inverted bit line; and the first terminal of the seventh transistor is connected to the first terminal of the eighth transistor, and is electrically coupled to the latch structure;

wherein when the non-volatile memory cell is powered off, the first memristor and the second memristor are configured to store the pair of bits, wherein when a voltage of the reading word line is at the working voltage, the bit line, the first control line and the second control line control the first read/write circuit to write data from the storage node into the first memristor, or read data from the first memristor into the storage node, and the inverted bit line, the first control line and the second control line control the second read/write circuit to write data from the inverted storage node into the second memristor, or read data from the second memristor to the inverted storage node.

2. The non-volatile memory cell of claim 1, wherein the latch structure comprises:
  a first inverter having an output terminal and an input terminal; and
  a second inverter having an output terminal and an input terminal,
  wherein the output terminal of the first inverter is coupled to the input terminal of the second inverter, and the output terminal of the second inverter is coupled to the input terminal the first inverter to form cross coupling,
  wherein the output terminal of the first inverter is the storage node of the latch structure, and the output terminal of the second inverter is the inverted storage node of the latch structure.

3. The non-volatile memory cell of claim 2, wherein the first inverter comprises a first transistor and a second transistor, and the second inverter comprises a third transistor and a fourth transistor,
  wherein each of the first transistor, the second transistor, the third transistor and the fourth transistor has a first terminal, second terminal and a control terminal,
  wherein the second terminal of the first transistor is connected to the first terminal of the second transistor, and is electrically coupled to the output terminal of the first inverter; the control terminal of the first transistor is connected to the control terminal of the second transistor, and is electrically coupled to the input terminal of the first inverter; and the first terminal of the first transistor is electrically coupled to the reading word line,
  wherein the second terminal of the third transistor is connected to the first terminal of the fourth transistor, and is electrically coupled to the output terminal of the second inverter; the control terminal of the third transistor is connected to the control terminal of the fourth transistor, and is electrically coupled to the input terminal of the second inverter; and the first terminal of the third transistor is electrically coupled to the reading word line.

4. The non-volatile memory cell of claim 1, wherein the first memristor has a first resistance after a writing operation is performed thereon, and the second memristor has a second resistance after the writing operation is performed thereon.

5. The non-volatile memory cell of claim 4, wherein the first memristor and the second memristor comprise a phase-change memory.

6. The non-volatile memory cell of claim 4, wherein,
  when the non-volatile memory cell performs a restore operation to read non-volatile data, the bit line and the inverted bit line turn on the sixth transistor and the eighth transistor;
  the first control line keeps at a low voltage to turn off the fifth transistor and the seventh transistor;
  the reading word line is raised from the low voltage to the working voltage to transiently raise a voltage of the storage node of the first inverter and a voltage of the inverted storage node of the second inverter; and accordingly,
  a voltage of the storage node and a voltage of the inverted storage node are respectively pushed to a high level and a low level due to a resistance difference between the first resistance and the second resistance.

7. The non-volatile memory cell of claim 4, wherein,
  when the writing operation is performed on the first memristor, the reading word line is set to a low voltage;
  the first control line is set to a high voltage to turn on the fifth transistor;
  the bit line is set to the high voltage to turn on the sixth transistor; and
  the second control line inputs a first writing pulse into the first memristor according to the bit in the storage node so as to set the first resistance.

8. The non-volatile memory cell of claim 4, wherein,
  when the writing operation is performed on the second memristor, the reading word line is set to a low voltage;
  the first control line is set to a high voltage to turn on the seventh transistor;
  the inverted bit line is set to the high voltage to turn on the eighth transistor; and
  the second control line inputs a second writing pulse into the second memristor according to the bit in the inverted storage node so as to set the second resistance.

9. A non-volatile memory device comprising:
  a plurality of non-volatile memory cells of claim 1, wherein each of the non-volatile memory cells is configured to save a bit, and is coupled to a respective reading word line, a respective bit line, a respective inverted bit line, a respective first control line, a respective second control line and a respective system ground.

* * * * *